(12) United States Patent
Yi

(10) Patent No.: US 8,711,569 B2
(45) Date of Patent: Apr. 29, 2014

(54) SERVER CHASSIS

(75) Inventor: Chieh-Shih Yi, Taipei Hsien (TW)

(73) Assignee: Giga-Byte Technology Co., Ltd., New Taipei (TW)

(*) Notice: Subject to any disclaimer, the term of this patent is extended or adjusted under 35 U.S.C. 154(b) by 194 days.

(21) Appl. No.: 13/417,328

(22) Filed: Mar. 12, 2012

(65) Prior Publication Data

US 2012/0293944 A1  Nov. 22, 2012

(30) Foreign Application Priority Data

May 20, 2011  (TW) .............................. 100117681 A

(51) Int. Cl.
*H05K 5/00* (2006.01)
(52) U.S. Cl.
USPC .......................................... 361/730; 361/810
(58) Field of Classification Search
USPC .................. 361/792, 730, 752, 807, 809, 810
See application file for complete search history.

(56) References Cited

U.S. PATENT DOCUMENTS

| | | | | |
|---|---|---|---|---|
| 5,031,074 A | * | 7/1991 | Ravid | 361/756 |
| 6,950,311 B1 | * | 9/2005 | DeCesare et al. | 361/727 |
| 7,839,624 B2 | * | 11/2010 | Lin | 361/679.02 |
| 7,894,195 B2 | * | 2/2011 | Lin | 361/727 |
| 7,894,208 B1 | * | 2/2011 | Lin | 361/796 |
| 2006/0227525 A1 | * | 10/2006 | Hoshino et al. | 361/796 |
| 2012/0057317 A1 | * | 3/2012 | Lin | 361/753 |

FOREIGN PATENT DOCUMENTS

| | | |
|---|---|---|
| JP | 1995-175554 A | 7/1995 |
| JP | 2000-149524 A | 5/2000 |
| JP | 2002-237178 A | 8/2002 |

* cited by examiner

*Primary Examiner* — Hung S Bui
(74) *Attorney, Agent, or Firm* — Chun-Ming Shih

(57) ABSTRACT

A server chassis includes a frame for accommodating a plurality of data storage devices and at least one tray for disposing a circuit board. The frame is provided with a connector and the tray is provided with a signal bridge board electrically connecting the circuit board with the connector. The circuit board could be coupled with the data storage devices through the signal bridge board without any use of cables.

6 Claims, 5 Drawing Sheets

SERVER CHASSIS

CROSS-REFERENCE TO RELATED APPLICATION

This application claims the benefit of the filing date of Taiwan Patent Application No. 100117681, filed on May 20, 2011, in the Taiwan Intellectual Property Office, the disclosure of which is incorporated herein in its entirety by reference.

FIELD OF THE INVENTION

The present invention relates to a chassis of an electronic device, and more particularly to a server chassis with a signal bridge board.

BACKGROUND OF THE INVENTION

Currently server host used in the industry, for example, stackable and serial rack mount computer, is usually disposed with a circuit board (ex. motherboard), a power supply and other electronic components at one side within the chassis thereof, wherein a central processing unit (CPU), chip set(s), memories, and the like are provided on the circuit board. Moreover, a plurality of data storage devices are settled at the other side within the chassis, and a plurality of cooling fans are disposed between the circuit board and the data storage devices for exhausting waste heat from the operation of the server host by airflow inside the chassis. Therefore, the server host could be operated at a proper working temperature, thereby enhancing the operating stability of the server host.

However, in the conventional server host, the data storage devices are electrically connected to the circuit board by respective cables. For this reason, the more data storage devices the chassis has, the more cables have to be used. The increased number of cables often results in the problem of entanglement, making it difficult to arrange the cables. Besides, when assembling the server host having a plurality of data storage devices, it is time consuming to get each data storage device be electrically connected to the circuit board via a cable.

Also, because the cable is usually long to some extent, part of the cables may occupy the space between the circuit board and the data storage devices in the chassis where the cooling fans are located. This will lead to not only an overcrowded chassis but also a block in the air inlet and/or air outlet of the cooling fan. As a result, the formation of airflow within the chassis may be affected badly so that the waste heat within the chassis cannot be emitted effectively by the cooling fan(s). As the heat accumulates inside, the temperature of the server host increases. It may be expected that the server host cannot work stably under this condition and will break down or fail soon.

SUMMARY OF THE INVENTION

In view of the above, the present invention provides a server chassis that can effectively solve the problems in prior art, which the procedure of the server chassis is too complicated and difficulty. Conventionally, a circuit board is electrically connected to a plurality of data storage devices by a plurality of cables, so it is time-consuming and not easy to assembly/disassembly the server chassis. Besides, the cables tend to be a hindrance to the air inlet or an air outlet of the cooling fan, so that the cooling fan can not provide a steady airflow within the server chassis, thereby negatively effecting the exhaust of waste heat.

The present invention discloses a server chassis used to dispose a circuit board and a plurality of data storage devices. The server chassis comprises a frame and at least one tray. The frame includes a backboard to which the plurality of the data storage devices in the frame are electrically connected. The backboard is equipped with at least one connector mounted thereon. The tray includes a signal bridge board with one end thereof electrically connected to the circuit board in the tray. The other end of the signal bridge board is electrically connected to the connector of the frame. When the data storage devices are placed in the tray, the circuit board is electrically coupled with the data storage devices through the signal bridge board.

In the present invention, the assembly time of the server chassis may be significantly decreased by the connector on the backboard of the frame and the signal bridge board of the tray. Once the signal bridge board of the tray is connected to the connector of the backboard, the circuit board is electrically coupled with the plurality of data storage devices In the meanwhile, the invention eliminates the use of cables between the frame and the tray, thereby allowing for significant saving of the cost and preventing the air inlet or air outlet of the cooling fan from being blocked. Therefore, waste heat in the server chassis can be exhausted smoothly as well.

The technical characteristics, realization and effects of the present invention will become apparent with the detailed description of preferred embodiments and related drawings as follows.

DETAILED DESCRIPTION OF EXEMPLARY EMBODIMENTS

Figure 1:
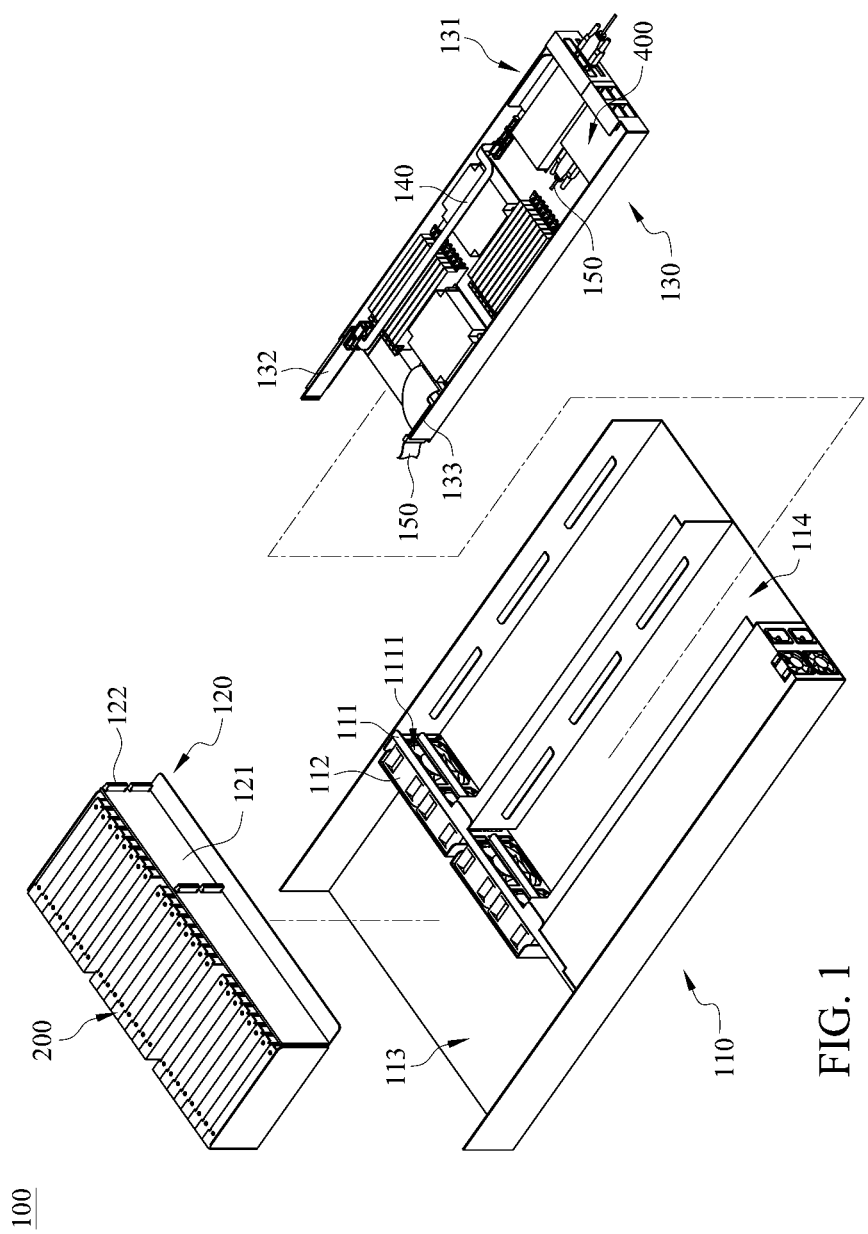
FIG. 1 is an exploded view of a server chassis according to an embodiment of the present invention.

FIG. 1 is an exploded view of a server chassis 100, according to an embodiment of the present invention. The server chassis 100 comprises a housing 110, a frame 120 and a tray 130. The housing 110 comprises a baffle 111 and a plurality of cooling fans 112 inside. The baffle 111 stands on a bottom of the housing 110 and divides the space of the housing 110 into a first assembling area 113 and a second assembling area 114. The plurality of cooling fans 112 are disposed in the first assembling area 113, and detachably arranged in the housing 110 along the baffle 111. An air inlet or an air outlet (not shown) of the cooling fan 112 is aligned with to a vent 1111 of the baffle 111, such that the airflow generated by the cooling fan 112 could be circulated among the first assembling area 113 and the second assembling area 114 through the vent 1111 of the baffle 111.

The frame 120 is disposed in the first assembling area 113 and the tray 130 is disposed in the second assembling area 114. The frame 120 has a backboard 121 which is a circuit board electrically equipped with at least one connector 122 (e.g. signal connector) on one face thereof and a plurality of data storage devices 200 disposed inside which could be, but not limited to, hard discs. The plurality of data storage devices 200 are arranged in array within the frame 120 and electrically connected to the other face of the backboard 121 free of the connector 122 for being electrically coupled with the connector 122 through the backboard 121.

Figure 2:
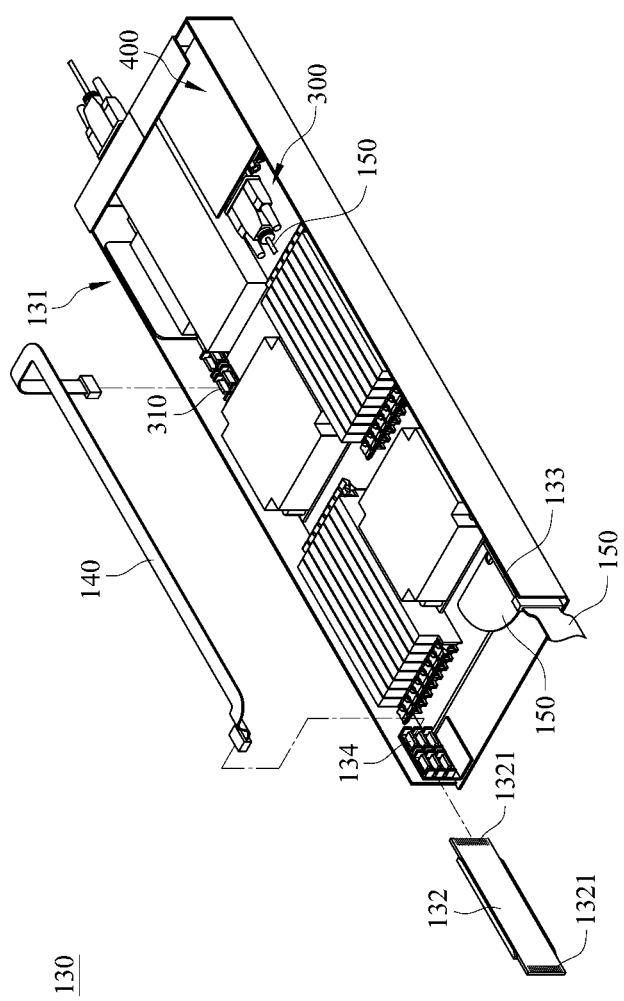
FIG. 2 is a partially exploded view of a server chassis according to an embodiment of the present invention.
Figure 3:
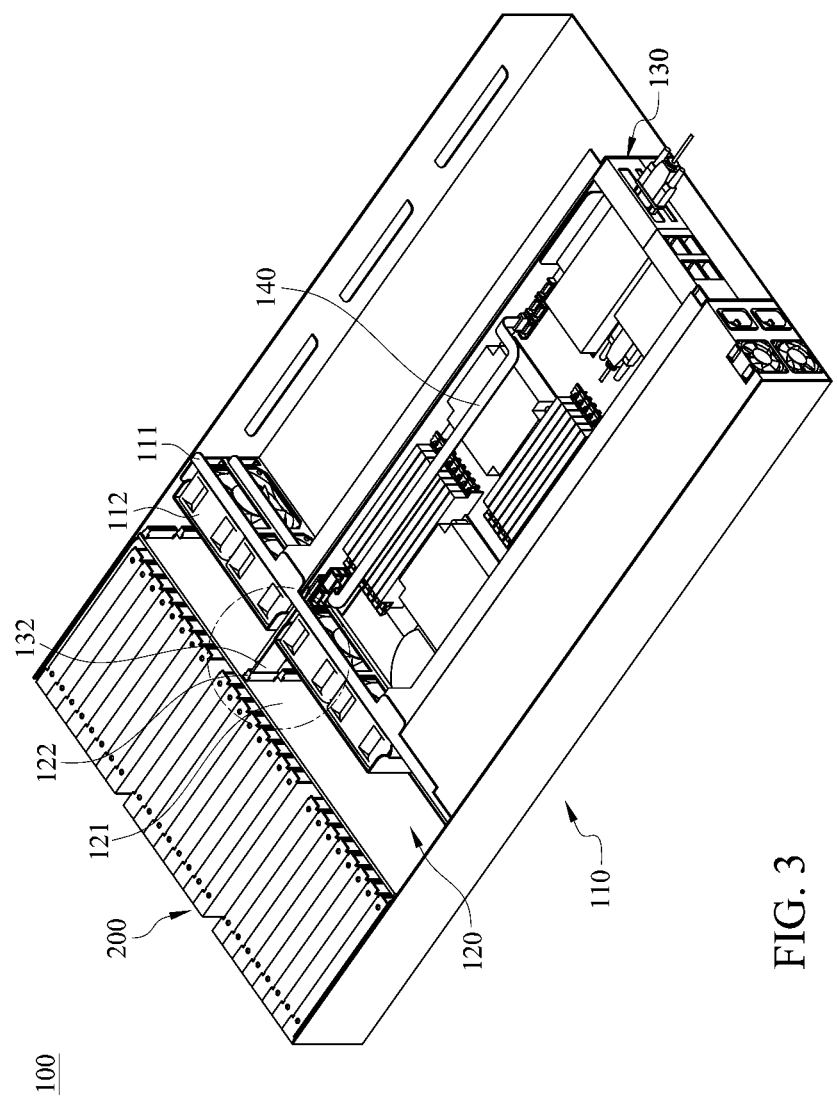
FIG. 3 is a schematic assembly view of a server chassis according to an embodiment of the present invention.
Figure 4:
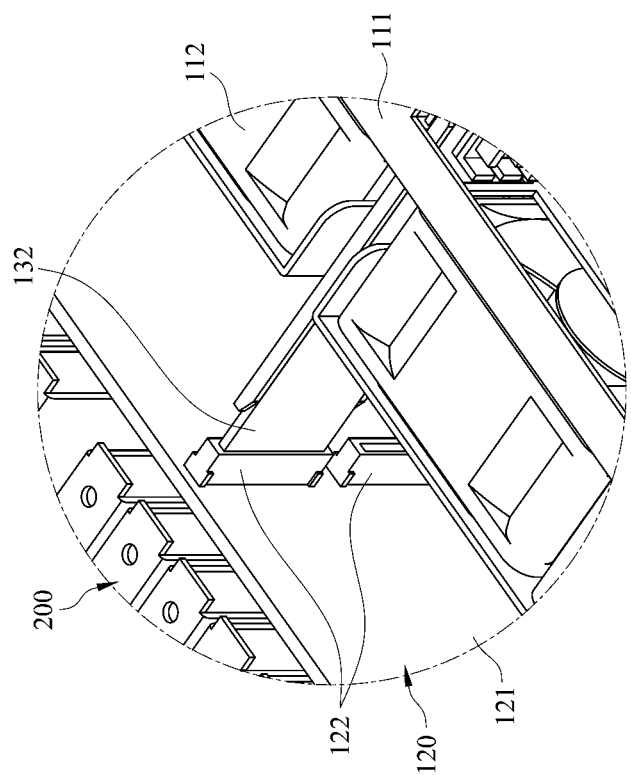
FIG. 4 is a partial enlarged view of FIG. 3.

As illustrated in FIG. 1 and FIG. 2, the tray 130 of the server chassis 100 comprises a main body 131, a signal bridge board 132 and a power bridge board 133. The main body 131 comprises some electronic devices such as a circuit board 300 and a power supply 400, wherein at least one socket 134 and 130 are respectively provided at one side edge of the main body 131 and the circuit board 300. That is, the main body 131 can be electrically connected to the circuit board 300 by a signal cable 140 used for connecting the main body 131 to the socket 134 and the socket 310 of the circuit board 300 respectively.

The signal bridge board 132 and the power bridge board 133 are disposed on one end of the main body 131 away from the power supply 400, and may be fastened to the main body 131 by, for example but not limited to, screwing with bolts or screws, punching with rivets, or welding with solder. Moreover, the signal bridge board 132 and the power bridge board 133 are electrically disposed on opposite sides of the main body 131, respectively, such that the signal bridge board 132 and the power bridge board 133 can be separated from each other to avoid the interference when the signal bridge board 132 and the power bridge board 133 are both in operation, such as electromagnetic disturbance (EMI).

Two adjacent sides of the power bridge board 133 are electrically connected to the circuit board 300 and the power supply 400 by a power cable 150 respectively, such that the circuit board 300 can be powered by the power supply 400 through the power bridge board 133. The signal bridge board 132 is provided with a golden finger 1321 separately at two opposite ends. Among the two golden fingers, one is electrically connected to the main body 131, and the other is placed in a direction extending from the main body 131 of the tray 130 towards the housing 110; that is, when the frame 120 is disposed within the housing 110, one of the two ends of the signal bridge board 132 having a golden finger 1321 mounted thereon will direct toward the frame 120 and face the connector 122 on the backboard 121 of the frame 120.

In addition, since the socket 134 of the main body 131 is electrically located on and connected to the golden finger 1321 of the signal bridge board 132, when two opposite terminals of the signal cable 140 are respectively plugged into the socket 134 of the main body 131 and the socket 310 of the circuit board 300, the signal bridge board 132 could be electrically connected to the circuit board 300 through the signal cable 140.

Now referring to FIG. 1 to FIG. 4, the frame 120 is located in the first assembly area 113 of the housing 110, and the tray 130 is disposed in the housing 110 by sliding forward from the second assembly area 114 of the housing 110 towards the frame 120, but removed from the housing 110 by sliding backward to the outside of the housing 110. When the tray 130 slides into the housing 110, the signal bridge board 132 of the tray 130 is aligned with and will be linked to the connector 122 of the frame 120 with the golden finger 1321. In this way, the signal bridge board 132 can be electrically connected to the backboard 121 of the frame 120. Accordingly, the circuit board 300 of the main body 131 of the tray 130 may be electrically coupled with the plurality of data storage devices 200 in the frame 120 by way of the signal bridge board 132, the connector 122 and the backboard 121.

When the frame 120 and the tray 130 are set in the housing 110, since the tray 130 is coupled with the connector 122 of the frame 120 via the signal bridge board 132, only the baffle 111 and the plurality of cooling fans 112 are located between the frame 120 and the tray 130. In more detail, the signal bridge board 132 is plugged into the connector 122 from the second assembly area 114 to the first assembly area 113 through a gap between the cooling fans 112 and the housing 110 or between two adjacent cooling fans.

As a result, the signal bridge board 132 is mainly disposed in a direction parallel to a central axis of the cooling fans 112 and located alongside the cooling fans 112, such that the air inlet or air outlet of the cooling fan 112 will not be hindered by the signal bridge board 132. In this way, when the cooling fans 112 operate, a steady airflow field can be formed inside the housing 110 for enhancing exhausting the waste heat generated by the central processing unit (CPU), graphic processing unit (GPU), and the like. Thus, a good performance of heat dissipation can be anticipated.

Figure 5:
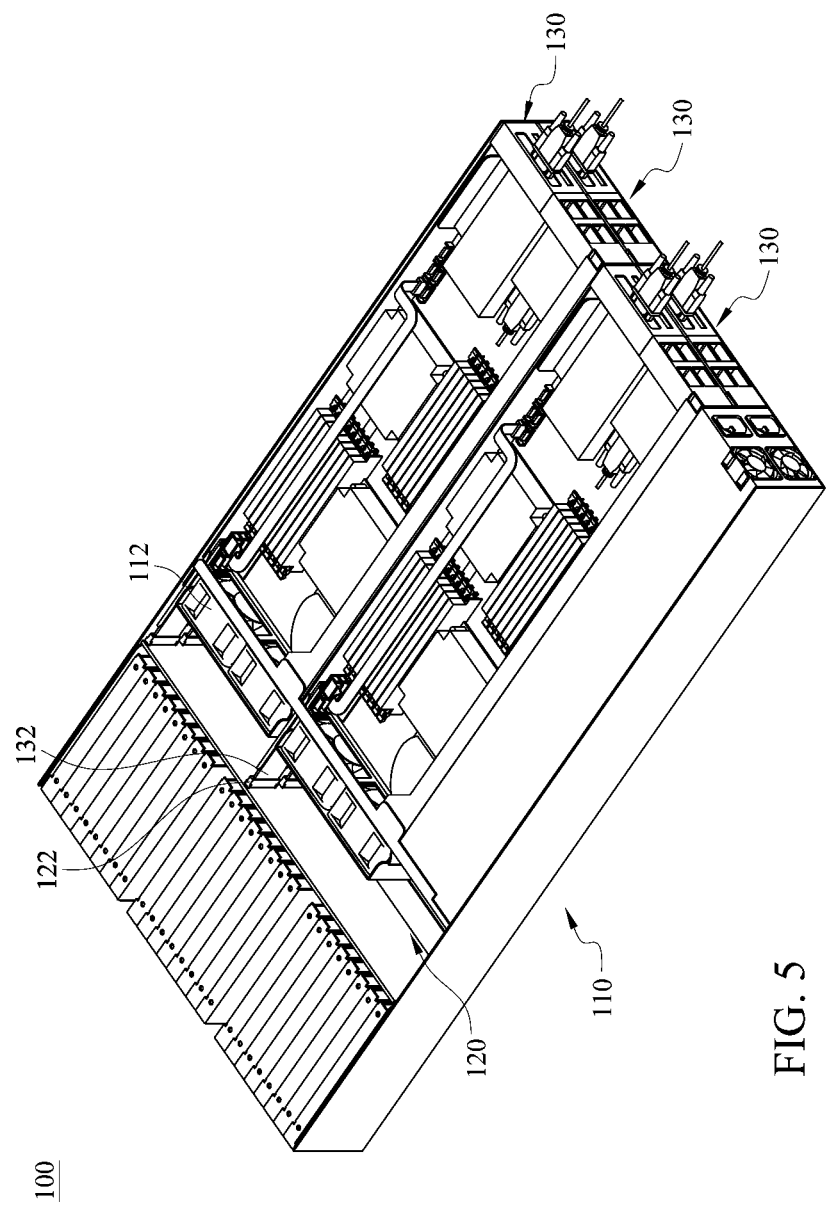
FIG. 5 is a schematic assembly view of a server chassis having a plurality of trays according to an embodiment of the present invention.

Although in the above embodiments, the arrangement of only a single tray disposed within the housing is exemplified, it is to be noted that a skilled person in the art may modify the number of the trays in the present invention as required. For example, as illustrated in FIG. 5, a plurality of trays 130 may be provided within the housing 110. Even for this case, the air inlets or air outlets of the cooling fans 112 will not be hindered, as the trays 130 each are coupled with the corresponding connectors 122 of the frame 120 via the signal bridge board 132. Hence, as mentioned above, a good heat dissipation effect can be realized.

As described above, according to this invention, by way of the at least one connector provided on the backboard and the signal bridge board provided in the tray, the circuit board in the tray may be electrically linked to the connector and further connected to the plurality of data storage devices in the frame. Thus, in addition to the merit of simplifying the assembly/disassembly procedure of trays, it is advantageous for the computer staff or users to save time in the operation of connecting the circuit board to the plurality of data storage devices. Moreover, due to eliminating the need of cables between the frame and the tray, cost is reduced and the long-existing problem is solved that the air inlet or air outlet of the cooling fan is readily hindered by the cables in the server chassis.

Furthermore, since the signal bridge board and the power bridge board are separated from each other by an appropriate spacing in the tray, the signal bridge board can be protected from any interference with the power during the process of signal transmission, thereby increasing the stability and accuracy of the signal transmission between the circuit board and the plurality of data storage devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A server chassis for disposing a circuit board and a plurality of data storage devices, the server chassis comprising:
   a frame comprising a backboard, the data storage devices being disposed in the frame and electrically connected to the backboard, wherein the backboard is equipped with at least one connector mounted thereon;
   at least one tray comprising a signal bridge board electrically connected to the circuit board disposed in the tray, one end of the signal bridge board being electrically disposed in the tray, and the other end of the signal bridge board being electrically connected to the connector of the frame; and a power bridge board electrically connected to the circuit board by a power cable, wherein the power bridge board and the signal bridge board are located at two sides of the tray opposed to each other;

wherein, when the data storage devices are accommodated in the tray, the circuit board is electrically connected to the data storage devices through the signal bridge board and the connector.

2. The server chassis of claim 1, further comprising a signal cable and, through the signal cable, the circuit board is electrically connected to the signal bridge board.

3. The server chassis of claim 1, wherein the signal bridge board is mounted in a direction from the tray towards the frame.

4. The server chassis of claim 1, wherein the signal bridge board is fastened to the tray by a rivet, a screw, or a bolt or by welding.

5. The server chassis of claim 1, wherein the power bridge board is fastened to the tray by a rivet, a screw, or a bolt or by welding.

6. A server chassis for disposing a circuit board and a plurality of data storage devices, the server chassis comprising:

a housing, comprising a baffle standing on a bottom of the housing and dividing the housing into a first assembling area and a second assembling area;

a frame detachably disposed in the first assembling area and comprising a backboard, the data storage devices being disposed in the frame and electrically connected to the backboard, wherein the backboard is equipped with at least one connector mounted thereon;

at least one tray disposed in the second assembling area and comprising a signal bridge board electrically connected to the circuit board disposed in the tray, one end of the signal bridge board being electrically disposed in the tray, and the other end of the signal bridge board being electrically connected to the connector of the frame;

wherein, when the data storage devices are accommodated in the tray, the circuit board is electrically connected to the data storage devices through the signal bridge board and the connector.

* * * * *